(12) United States Patent
Etter et al.

(10) Patent No.: US 10,413,116 B2
(45) Date of Patent: *Sep. 17, 2019

(54) HEATING DEVICE WITH AN INTEGRATED THERMOBLOCK FOR A BEVERAGE PREPARATION MACHINE

(71) Applicant: Nestec S.A., Vevey (CH)

(72) Inventors: Stefan Etter, Kehrsatz (CH); Urs Gaudenz, Lucern (CH); Gilles Gavillet, Ursy (CH); Thomas Hodel, Hagendorn (CH); Alexandre Kollep, Lutry (CH); Peter Möri, Walperswil (CH); Renzo Moser, Gümmenen (CH); Peter Preisig, Herisau (CH); Robin Schwab, Bukoba (TZ)

(73) Assignee: Societe des Produits Nestle S.A., Vevey (CH)

( * ) Notice: Subject to any disclaimer, the term of this patent is extended or adjusted under 35 U.S.C. 154(b) by 1209 days.

This patent is subject to a terminal disclaimer.

(21) Appl. No.: 14/039,404

(22) Filed: Sep. 27, 2013

(65) Prior Publication Data

US 2014/0020563 A1 Jan. 23, 2014

Related U.S. Application Data

(62) Division of application No. 12/681,362, filed as application No. PCT/EP2008/063128 on Oct. 1, 2008, now Pat. No. 8,573,116.

(30) Foreign Application Priority Data

Oct. 4, 2007 (EP) .................................... 07117853
Apr. 22, 2008 (EP) .................................... 08154918

(Continued)

(51) Int. Cl.
A47J 31/40 (2006.01)
A47J 31/44 (2006.01)
(Continued)

(52) U.S. Cl.
CPC .......... *A47J 31/441* (2013.01); *A47J 31/407* (2013.01); *A47J 31/542* (2013.01); *A47J 31/545* (2013.01);
(Continued)

(58) Field of Classification Search
CPC ...... A47J 31/542; A47J 31/441; A47J 31/407; A47J 31/545; F24H 1/101; F24H 9/2028;
(Continued)

(56) References Cited

U.S. PATENT DOCUMENTS

| 1,437,005 A | 11/1922 | Newsom ........................ 219/441 |
| 1,513,685 A | 10/1924 | Ardovino ........................ 99/281 |

(Continued)

FOREIGN PATENT DOCUMENTS

| CA | 2 656 200 A1 | 1/2008 |
| CH | 503 630 A | 2/1971 |

(Continued)

OTHER PUBLICATIONS

International Search Report, Appl. No. PCT/EP2009/053139, dated Jul. 20, 2009.

(Continued)

*Primary Examiner* — Ibrahime A Abraham
*Assistant Examiner* — Justin C Dodson
(74) *Attorney, Agent, or Firm* — K&L Gates LLP

(57) ABSTRACT

A combination of a flow meter and printed circuit board or flex-print for a liquid food or a beverage preparation machine, which board or flex-print is rigidly connected to the flow meter. This combination is used in a liquid food or beverage preparation machine that includes an in-line heat- (Continued)

ing device in which machine liquid is circulated through the heating device and then guided into a brewing chamber that includes a capsule or pod housing for brewing a food or beverage ingredient supplied into the brewing chamber.

17 Claims, 9 Drawing Sheets

(30) Foreign Application Priority Data

May 22, 2008 (EP) .................................... 08156704
Sep. 30, 2008 (WO) ................. PCT/EP2008/063092

(51) Int. Cl.
    *A47J 31/54*     (2006.01)
    *F24H 1/10*     (2006.01)
    *F24H 9/20*     (2006.01)
    *H05K 1/18*     (2006.01)
    *H05K 3/30*     (2006.01)
    *H01H 37/52*     (2006.01)

(52) U.S. Cl.
    CPC ............ *F24H 1/101* (2013.01); *F24H 9/2028* (2013.01); *H01H 37/52* (2013.01); *H05K 1/18* (2013.01); *H05K 3/306* (2013.01); *H05K 2201/105* (2013.01); *H05K 2201/10151* (2013.01); *H05K 2201/10166* (2013.01); *H05K 2201/10181* (2013.01); *H05K 2201/10189* (2013.01); *H05K 2201/10424* (2013.01); *H05K 2201/2036* (2013.01)

(58) Field of Classification Search
    CPC ................... H05K 1/18; H05K 3/306; H05K 2201/10151; H05K 2201/10166; H05K 2201/10181; H05K 2201/10189; H05K 2201/10424; H05K 2201/105; H05K 2201/2036; H01H 37/52
    See application file for complete search history.

(56) References Cited

U.S. PATENT DOCUMENTS

| | | | |
|---|---|---|---|
| 2,514,360 A | 7/1950 | Alvarez | 392/465 |
| 2,715,868 A | 8/1955 | Brown | 99/302 R |
| 3,260,190 A | 7/1966 | Levinson | 99/295 |
| 3,286,618 A | 11/1966 | Barrera | 99/302 R |
| 3,320,572 A | 5/1967 | Schwartz | 439/80 |
| 3,374,979 A | 3/1968 | Coldren et al. | 248/222.12 |
| 3,622,750 A | 11/1971 | Watts, Jr. | 392/407 |
| 3,919,520 A | 11/1975 | Pickard | 219/208 |
| 4,242,568 A | 12/1980 | Wunderlin et al. | 392/407 |
| 4,320,626 A | 3/1982 | Donnelly | 62/3.64 |
| 4,357,520 A * | 11/1982 | Taylor | A47J 27/62 219/436 |
| 4,551,611 A | 11/1985 | Longo | 392/451 |
| 4,589,374 A | 5/1986 | Farina | 122/18.31 |
| 4,595,131 A | 6/1986 | Ruskin et al. | 222/640 |
| 4,760,774 A | 8/1988 | Lin | 99/299 |
| 4,871,089 A | 10/1989 | Rader et al. | 222/54 |
| 4,949,627 A | 8/1990 | Nordskog | 99/281 |
| 5,019,690 A | 5/1991 | Knepler | 219/400 |
| 5,063,836 A | 11/1991 | Patel | 99/281 |
| 5,161,455 A | 11/1992 | Anson et al. | 99/280 |
| 5,257,341 A | 10/1993 | Austin, Jr. et al. | 392/487 |
| 5,335,553 A | 8/1994 | Ueki et al. | |
| 5,392,694 A | 2/1995 | Muller et al. | 99/295 |
| 5,421,247 A * | 6/1995 | Shim | A23B 7/10 435/286.1 |
| 5,531,152 A | 7/1996 | Gardosi | 99/289 R |
| 5,709,574 A | 1/1998 | Bianca et al. | 439/858 |
| 5,755,149 A | 5/1998 | Blanc et al. | 99/289 T |
| 5,776,527 A | 7/1998 | Blanc | 426/77 |
| 5,794,519 A | 8/1998 | Fischer | 99/295 |
| 5,836,236 A | 11/1998 | Rolfes et al. | 99/290 |
| 5,855,161 A | 1/1999 | Cortese | 99/289 P |
| 5,869,818 A | 2/1999 | Kim | |
| 5,901,636 A | 5/1999 | Witziers et al. | 99/283 |
| 5,943,472 A | 8/1999 | Charles et al. | 392/396 |
| 5,957,033 A | 9/1999 | In-Albon | 99/284 |
| 5,992,298 A | 11/1999 | Illy et al. | 99/281 |
| 6,009,792 A | 1/2000 | Kraan | 99/295 |
| 6,025,000 A | 2/2000 | Fond et al. | 426/433 |
| 6,026,732 A | 2/2000 | Kollep et al. | 99/295 |
| 6,032,481 A | 3/2000 | Mosby | 62/457.2 |
| 6,035,762 A | 3/2000 | Ruckstuhl | 99/295 |
| 6,036,530 A | 3/2000 | Edwards et al. | 439/455 |
| 6,062,732 A | 5/2000 | Scott | 383/24 |
| 6,098,525 A | 8/2000 | Gijzel et al. | 99/282 |
| 6,267,602 B1 * | 7/2001 | Mendelson | H01R 13/6205 439/38 |
| 6,389,226 B1 | 5/2002 | Neale et al. | 392/485 |
| 6,393,967 B2 | 5/2002 | Fischer | 99/285 |
| 6,415,957 B1 * | 7/2002 | Michaels | A45D 27/02 219/214 |
| 6,453,800 B1 | 9/2002 | Chen | 99/289 R |
| 6,487,919 B1 | 12/2002 | Edwards | |
| 6,554,588 B1 | 4/2003 | DiBenedetto | 417/417 |
| 6,698,332 B2 | 3/2004 | Kollep et al. | 99/289 R |
| 6,748,850 B1 | 6/2004 | Kraan | 99/289 R |
| 6,889,598 B2 | 5/2005 | Wroblewski | 99/275 |
| 6,954,973 B2 | 10/2005 | Zirbs | 29/407.04 |
| 6,966,251 B2 | 11/2005 | Yoakim | 99/295 |
| 6,976,636 B2 * | 12/2005 | Thweatt, Jr. | F24H 9/2028 219/481 |
| 6,994,015 B2 | 2/2006 | Bruinsma | 99/289 R |
| 7,017,474 B2 | 3/2006 | Comte | 99/302 P |
| 7,077,053 B2 | 7/2006 | Kraan | 99/295 |
| 7,131,369 B2 | 11/2006 | Gantt et al. | 99/289 R |
| 7,165,488 B2 | 1/2007 | Bragg et al. | 99/295 |
| 7,196,293 B2 * | 3/2007 | Britto | H01R 13/7038 219/387 |
| 7,231,869 B2 | 6/2007 | Halliday et al. | 99/289 R |
| 7,286,752 B2 | 10/2007 | Gourand | 392/479 |
| 7,287,461 B2 | 10/2007 | Halliday et al. | 99/295 |
| 7,316,178 B2 | 1/2008 | Halliday et al. | 99/295 |
| 7,383,763 B2 | 6/2008 | Dijs | 99/295 |
| 7,418,899 B2 | 9/2008 | Halliday et al. | 99/295 |
| 7,444,927 B1 | 11/2008 | Crosville et al. | 99/295 |
| 7,562,618 B2 | 7/2009 | Jarisch et al. | 99/289 R |
| 7,569,243 B2 | 8/2009 | Yoakim et al. | 426/433 |
| 7,703,380 B2 | 4/2010 | Ryser et al. | 99/295 |
| 7,740,511 B2 | 6/2010 | Katano | 439/816 |
| 7,959,090 B2 | 6/2011 | Shank et al. | 239/130 |
| 2002/0050915 A1 * | 5/2002 | Riehl | G01D 11/245 338/32 H |
| 2002/0148357 A1 | 10/2002 | Lazaris et al. | 99/295 |
| 2003/0019367 A1 | 1/2003 | Fogagnolo et al. | 99/330 |
| 2003/0047080 A1 | 3/2003 | Wu | 99/279 |
| 2003/0066431 A1 * | 4/2003 | Fanzutti | A47J 31/36 99/279 |
| 2004/0016348 A1 * | 1/2004 | Sharpe | A47J 37/10 99/331 |
| 2004/0031394 A1 | 2/2004 | Yoakim et al. | 99/279 |
| 2004/0101293 A1 | 5/2004 | Bissonnette et al. | 392/484 |
| 2004/0250686 A1 | 12/2004 | Hale | 99/295 |
| 2004/0264951 A1 | 12/2004 | Kuebler et al. | 392/485 |
| 2005/0051031 A1 * | 3/2005 | Pan | A47J 31/306 99/279 |
| 2005/0106288 A1 | 5/2005 | Blanc et al. | 426/77 |
| 2005/0107919 A1 | 5/2005 | Watanabe et al. | 700/245 |
| 2005/0160917 A1 | 7/2005 | Gantt et al. | |
| 2005/0160918 A1 * | 7/2005 | Winstanley | A47J 31/34 99/279 |
| 2005/0183578 A1 * | 8/2005 | Mandralis | A47J 31/0673 99/279 |
| 2005/0235834 A1 | 10/2005 | Blanc et al. | 99/279 |
| 2006/0102008 A1 | 5/2006 | Lin | 99/279 |
| 2007/0012685 A1 | 1/2007 | Gourand | 219/628 |
| 2007/0044664 A1 | 3/2007 | Wang | 99/279 |

(56) References Cited

U.S. PATENT DOCUMENTS

| | | | |
|---|---|---|---|
| 2007/0104837 A1 | 5/2007 | Yoakim et al. | 426/77 |
| 2007/0289452 A1* | 12/2007 | Hofer | A47J 31/368 99/295 |
| 2008/0006159 A1 | 1/2008 | Fischer | 99/289 R |
| 2008/0028947 A1 | 2/2008 | Magg et al. | 99/288 |
| 2008/0050491 A1* | 2/2008 | Ramus | A47J 31/56 426/520 |
| 2008/0090473 A1 | 4/2008 | Katano | 439/816 |
| 2008/0203870 A1 | 8/2008 | Riley et al. | 312/265.6 |
| 2008/0236403 A1 | 10/2008 | Cortese | 99/323 |
| 2008/0273868 A1 | 11/2008 | Boussemart et al. | 392/479 |
| 2009/0154909 A1 | 6/2009 | Meyer | 392/473 |
| 2009/0205503 A1 | 8/2009 | Cortese | 99/295 |
| 2009/0249961 A1 | 10/2009 | Cheng | 99/289 R |
| 2009/0308259 A1 | 12/2009 | Hiron | 99/323.3 |
| 2010/0011965 A1 | 1/2010 | Turi | 99/289 R |
| 2010/0071563 A1 | 3/2010 | Ryser et al. | 99/295 |
| 2010/0101428 A1 | 4/2010 | Fin | 99/295 |
| 2010/0173053 A1 | 7/2010 | Ryser et al. | 426/431 |
| 2010/0206177 A1 | 8/2010 | Ricotti | 99/295 |
| 2010/0218684 A1 | 9/2010 | Etter et al. | 99/288 |
| 2010/0224077 A1 | 9/2010 | Jing | 99/295 |
| 2010/0282090 A1 | 11/2010 | Etter et al. | 99/288 |
| 2010/0288132 A1 | 11/2010 | Gavillet et al. | 99/295 |
| 2011/0000377 A1 | 1/2011 | Favre | 99/289 R |
| 2011/0041696 A1 | 2/2011 | Aemisegger et al. | 99/281 |
| 2011/0126717 A1 | 6/2011 | Gavillet et al. | 99/288 |

FOREIGN PATENT DOCUMENTS

| | | |
|---|---|---|
| CH | 593 044 A5 | 11/1977 |
| CH | 682 798 A5 | 11/1993 |
| CN | 1137742 A | 12/1996 |
| CN | 1476304 A | 2/2004 |
| CN | 1905827 A | 1/2007 |
| CN | 1919121 A | 2/2007 |
| CN | 101073470 A | 11/2007 |
| CN | 101162809 A | 4/2008 |
| DE | 15 90 068 A1 | 4/1970 |
| DE | 20 19 445 A1 | 11/1971 |
| DE | 196 47 039 C2 | 7/1997 |
| DE | 197 37 694 C1 | 10/1998 |
| DE | 197 32 414 A1 | 2/1999 |
| DE | 103 22 034 A1 | 12/2004 |
| EP | 0 387 515 A1 | 9/1990 |
| EP | 0 485 211 B1 | 5/1992 |
| EP | 0 512 142 A1 | 11/1992 |
| EP | 0 512 148 A1 | 11/1992 |
| EP | 0 602 203 B1 | 6/1994 |
| EP | 0 604 615 A1 | 7/1994 |
| EP | 0 730 425 B1 | 9/1996 |
| EP | 0 761 150 A1 | 3/1997 |
| EP | 0 784 955 A1 | 7/1997 |
| EP | 0 862 882 B1 | 9/1998 |
| EP | 0 891 734 A1 | 1/1999 |
| EP | 0 904 717 A1 | 3/1999 |
| EP | 1 050 258 B1 | 11/2000 |
| EP | 1 121 882 A2 | 8/2001 |
| EP | 1 133 010 A1 | 9/2001 |
| EP | 1 153 561 B1 | 11/2001 |
| EP | 1 208 782 B1 | 5/2002 |
| EP | 1 219 217 B1 | 7/2002 |
| EP | 1 253 844 B1 | 11/2002 |
| EP | 1 299 022 B1 | 4/2003 |
| EP | 1 380 243 B1 | 1/2004 |
| EP | 1 480 540 B1 | 12/2004 |
| EP | 1 486 150 B1 | 12/2004 |
| EP | 1 495 702 A1 | 1/2005 |
| EP | 1 529 469 A1 | 5/2005 |
| EP | 1 610 596 B1 | 12/2005 |
| EP | 1 635 680 B1 | 3/2006 |
| EP | 1 646 305 B1 | 4/2006 |
| EP | 1 659 547 A1 | 5/2006 |
| EP | 1 669 011 A1 | 6/2006 |
| EP | 1 721 553 B1 | 11/2006 |
| EP | 1 757 212 A2 | 2/2007 |
| EP | 1 774 878 B1 | 4/2007 |
| EP | 1 774 884 A1 | 4/2007 |
| EP | 1 775 234 A1 | 4/2007 |
| EP | 1 776 026 B1 | 4/2007 |
| EP | 1 809 151 B1 | 7/2007 |
| EP | 1 829 469 B1 | 9/2007 |
| EP | 1 859 714 B1 | 11/2007 |
| EP | 1 864 598 A1 | 12/2007 |
| EP | 1 878 368 B1 | 1/2008 |
| EP | 1 893 064 B1 | 3/2008 |
| EP | 2 103 236 A1 | 9/2009 |
| EP | 2 181 629 A1 | 5/2010 |
| EP | 2 218 368 A2 | 8/2010 |
| EP | 2 218 369 A2 | 8/2010 |
| EP | 2 218 370 A2 | 8/2010 |
| EP | 2 374 383 A1 | 10/2011 |
| FR | 1 358 502 A | 4/1964 |
| FR | 2 424 010 A1 | 11/1979 |
| FR | 2 745 995 A1 | 9/1997 |
| FR | 2 799 630 A1 | 4/2001 |
| FR | 2 855 359 A1 | 11/2004 |
| FR | 2 898 734 A1 | 9/2007 |
| FR | 2 904 205 A1 | 2/2008 |
| GB | 847662 A | 9/1960 |
| JP | 1-38493 B2 | 8/1989 |
| JP | 4-34405 B2 | 6/1992 |
| JP | 2002-050726 A | 2/2002 |
| JP | 2003-508102 A | 3/2003 |
| JP | 2003-512117 A | 4/2003 |
| JP | 2004-514488 A | 5/2004 |
| JP | 2004-173823 A | 6/2004 |
| JP | 2005-149216 A | 6/2005 |
| JP | 2006-280208 A | 10/2006 |
| JP | 2007-501506 A | 1/2007 |
| JP | 2007-506474 A | 3/2007 |
| JP | 2007-513697 A | 5/2007 |
| JP | 2009-511102 A | 3/2009 |
| LU | 85316 | 9/1984 |
| SU | 1808642 A1 | 4/1993 |
| TW | 322459 | 12/1997 |
| WO | WO 94/01344 A1 | 1/1994 |
| WO | WO 95/07041 A1 | 3/1995 |
| WO | WO 95/17121 A1 | 6/1995 |
| WO | WO 98/47418 A1 | 10/1998 |
| WO | WO 99/51947 A1 | 10/1999 |
| WO | WO 00/45685 A2 | 8/2000 |
| WO | WO 01/30218 A1 | 5/2001 |
| WO | WO 01/54551 A1 | 8/2001 |
| WO | WO 01/60221 A1 | 8/2001 |
| WO | WO 02/074144 A2 | 9/2002 |
| WO | WO 03/030696 A1 | 4/2003 |
| WO | WO 03/073897 A1 | 9/2003 |
| WO | WO 2004/006742 A1 | 1/2004 |
| WO | WO 2004/069012 A1 | 8/2004 |
| WO | WO 2004/105438 A1 | 12/2004 |
| WO | WO 2005/002405 A2 | 1/2005 |
| WO | WO 2005/004683 A1 | 1/2005 |
| WO | WO 2005/016093 A1 | 2/2005 |
| WO | WO 2005/058111 A1 | 6/2005 |
| WO | WO 2005/060801 A1 | 7/2005 |
| WO | WO 2005/072574 A1 | 8/2005 |
| WO | WO 2005/072586 A1 | 8/2005 |
| WO | WO 2005/099534 A1 | 10/2005 |
| WO | WO 2006/003116 A1 | 1/2006 |
| WO | WO 2006/005736 A2 | 1/2006 |
| WO | WO 2006/005756 A1 | 1/2006 |
| WO | WO 2006/023309 A2 | 3/2006 |
| WO | WO 2006/066626 A1 | 6/2006 |
| WO | WO 2006/104575 A1 | 10/2006 |
| WO | WO 2007/016977 A1 | 2/2007 |
| WO | WO 2007/039683 A1 | 4/2007 |
| WO | WO 2007/111884 A2 | 10/2007 |
| WO | WO 2007/118944 A1 | 10/2007 |
| WO | WO 2007/122144 A1 | 11/2007 |
| WO | WO 2007/135136 A1 | 11/2007 |
| WO | WO 2008/004116 A1 | 1/2008 |
| WO | WO 2008/012316 A2 | 1/2008 |

(56) References Cited

FOREIGN PATENT DOCUMENTS

| WO | WO 2008/014830 A1 | 2/2008 |
|----|-------------------|--------|
| WO | WO 2008/037642 A2 | 4/2008 |
| WO | WO 2008/046740 A1 | 4/2008 |
| WO | WO 2008/154805 A1 | 12/2008 |
| WO | WO 2009/043630 A2 | 4/2009 |
| WO | WO 2009/043851 A2 | 4/2009 |
| WO | WO 2009/043865 A2 | 4/2009 |
| WO | WO 2009/074550 A2 | 6/2009 |
| WO | WO 2009/130099 A1 | 10/2009 |
| WO | WO 2010/015427 A1 | 2/2010 |

OTHER PUBLICATIONS

International Search Report, Appl. No. PCT/EP2009/053368, dated Oct. 6, 2009.
International Search Report, Appl. No. PCT/EP2008/063128, dated May 8, 2009.
International Search Report, Appl. No. PCT/EP2008/063092, dated Jul. 6, 2009.
International Search Report, Appl. No. PCT/EP2008/060463, dated Apr. 1, 2009.
European Opposition, Appl. No. EP 08802980.0, published evidence, article "Thais expresso zetten van professionele allure," Door Jaqueline Bosboom, 1 page, dated Jun. 19, 2004.
European Opposition, Appl. No. EP 08802980.0, published evidence, pictures of prior used Essenza, 13 pages, dated Dec. 30, 2011.
European Opposition, Appl. No. EP 08802980.0, Magimix Nespresso Essenza Instruction Manual, Essenza Automatic with English translation, 11 pages, dated Sep. 2004.
U.S. Appl. No. 12/681,362, filed Apr. 1, 2010.
U.S. Appl. No. 12/681,535, filed May 28, 2010.
U.S. Appl. No. 12/681,577, filed Apr. 2, 2010.
U.S. Appl. No. 12/989,072, filed Oct. 21, 2010.
U.S. Appl. No. 13/055,355, filed Jan. 21, 2011.
U.S. Appl. No. 12/681,535, Non-Final Office Action, dated Mar. 13, 2013.
U.S. Appl. No. 12/681,577, Non-Final Office Action, dated Jul. 5, 2012.
U.S. Appl. No. 12/681,577, Notice of Allowance, dated Mar. 12. 2013.
U.S. Appl. No. 12/989,072, Non-Final Office Action, dated Apr. 15, 2013.
U.S. Appl. No. 13/055,355, Restriction Requirement, dated Mar. 20, 2013.
U.S. Appl. No. 12/681,362, Restriction Requirement, dated Sep. 17, 2012.
U.S. Appl. No. 12/681,362, Non-Final Office Action, dated Nov. 30, 2012.
U.S. Appl. No. 12/681,362, Notice of Allowance, dated Jul. 8, 2013.
U.S. Appl. No. 12/681,535, Notice of Allowance, dated Aug. 5, 2013.
U.S. Appl. No. 12/681,577, Restriction Requirement, dated May 11, 2012.
U.S. Appl. No. 12/681,577, Final Office Action, dated Jan. 4, 2013.
U.S. Appl. No. 12/989,072, Final Office Action, dated Jun. 26, 2013.
U.S. Appl. No. 13/055,355, Non-Final Office Action, dated Jun. 20, 2013.

* cited by examiner

HEATING DEVICE WITH AN INTEGRATED THERMOBLOCK FOR A BEVERAGE PREPARATION MACHINE

CROSS-REFERENCE TO RELATED APPLICATIONS

This application is a division of application Ser. No. 12/681,362 filed on Apr. 1, 2010, which is the 371 filing of International application no. PCT/EP2008/063128 filed on Oct. 1, 2008, which claims priority to European patent applications nos. EP 07117853.7 filed on Oct. 4, 2007, EP 08154918.0 filed on Apr. 22, 2008, and EP 08156704.2 filed on May 22, 2008 and International application no. PCT/EP2008/063092 filed on Sep. 30, 2008.

FIELD OF THE INVENTION

The present invention concerns a heating device with an integrated thermoblock for the heating of a liquid in a liquid food or a beverage preparation machine.

BACKGROUND ART

Liquid food and beverage preparation machines have been known for a number of years. For example, U.S. Pat. No. 5,943,472 discloses a water circulation system between a water reservoir and a hot water or vapour distribution chamber of an espresso machine. The circulation system includes a valve, metallic heating tube and pump that are connected together and to the reservoir via different silicone hoses, which are joined using clamping collars.

EP 1 646 305 discloses a beverage preparation machine with a heating device that heats circulating water which is then supplied to the inlet of a brewing unit. The brewing unit is arranged to pass heated water to a capsule containing a beverage ingredient for its brewing. The brewing unit has a chamber delimited by a first part and a second part movable relative to the first part and a guide for positioning a capsule in an intermediate position between the first and second parts before moving the first and second parts together from an open to a closed configuration of the brewing unit.

In-line heaters for heating circulating liquid, in particular water are also well known and are for example disclosed in CH 593 044, DE 103 22 034, DE 197 32 414, DE 197 37 694, EP 0 485 211, FR 2 799 630, U.S. Pat. Nos. 4,242,568, 4,595,131, 5,019,690, 5,392,694, 5,943,472, 6,393,967, 6,889,598, 7,286,752, WO 01/54551 and WO 2004/006742.

More particularly, CH 593 044 and U.S. Pat. No. 4,242,568 disclose a coffee machine with an inline thermoblock heater having a metal mass with resistive heating cable cast in the mass and with a duct for the circulation of water to be heated.

EP 0 485 211 discloses a heater for a water heater, shower, washing machine, dishwasher or kettle. The heater includes a vessel for heating liquid, and an electric heating element which is arranged to heat a portion of the vessel. The heating element incorporates a thick-film resistive heating circuit with a thermal fuse included in the thick-film. The document further discloses a triac-type power regulator mounted directly on the heating element that acts as a heat sinker for this triac. Also disclosed is the presence of a thermistor, a temperature sensor, formed on the thick film, a thermal fuse, a flow control valve to continuously adjust the flow rate through the heater, a flow control and a temperature control. These electrical components are connected to a control unit that can be remote or formed as part of the dielectric layer of the thick film at a location close to the inlet pipe where the heater's metal substrate is kept cool by incoming cold water. Similar ideas are disclosed in DE 103 22 034, DE 197 32 414 and DE 197 37 694. In-line tubular heaters for beverage preparation devices are disclosed in WO 01/54551, WO 2004/006742 and U.S. Pat. No. 7,286,752.

U.S. Pat. No. 6,889,598 discloses a beverage device containing a liquid and having an operating apparatus for heating, cooling, agitating, whipping, pumping or frothing the liquid or grinding an ingredient, the operating apparatus being powered via an electronic switch such as a triac that is cooled by being in heat passing relationship with the liquid so as to evacuate the heat produced by the switch to the liquid, in particular via the bottom of a liquid heating tank made of steel or aluminium, and optionally with a radiator.

Moreover, U.S. Pat. No. 5,019,690 discloses a boiling water dispenser that has a resistive heater powered via a triac switch connected via cables to a control module and mounted on the bottom of the dispenser's water reservoir to evacuate heat generated at the triac switch via the water.

U.S. Pat. No. 4,595,131 discloses a beverage preparation machine with a water heating reservoir that is electrically connected to a printed circuit board via a series of cables leading to a thermostatically controlled heater and a thermistor probe in the reservoir. EP 1 610 596 discloses a heat evacuation system for a printed circuit board that includes layers of thermally highly conductive material extending to a thermally conductive bar located at and along an edge of the printed circuit board for dissipation of heat generated by the printed circuit board.

FR 2 799 630 discloses an espresso machine having a cold water reservoir connected to a brewing unit via a pump and a thermoblock. The thermoblock includes a temperature sensor and an electric heater. The temperature sensor and the heater are connected to a printed circuit board with a controller, electric power being passed to the heater via a triac located on the printed circuit board and controlled by the controller.

SUMMARY OF THE INVENTION

The overall goal of the present invention is to simplify and improve the incorporation of the heating function in a liquid food or beverage preparation machine to facilitate and permit an increased automation of the assembly of the machine, reduce the manufacturing operations and costs and increase the reliability of the machine.

This is in particular achieved by providing a heating device that integrates electrical and optionally fluid connections without requiring any flexible and deformable cable or tubes, for guiding current or liquid, to connect the heating function to other functional units of the liquid food or beverage preparation machine, or at least to limit the number of such flexible and deformable connections.

Therefore, the present invention relates to an in-line heating device for a liquid food or beverage preparation machine. In such a machine, liquid is circulated, for instance from a liquid reservoir via a pump, through this heating device. Typically, the liquid that is circulated through the heating device is water. From the heating device, the heated liquid is guided into a machine's brewing chamber in which an ingredient may be brewed. The brewing chamber may include a capsule or pod housing, e.g. receiver, for housing an ingredient supplied within a capsule or pod into the brewing chamber.

For instance, the brewing chamber is arranged to contain a food or beverage ingredient, such as powder soup, ground coffee or tea optionally in a capsule or a pod. The brewing chamber may have an upstream part into which hot liquid is injected for brewing the food or beverage ingredient contained in the chamber and a downstream part leading into an outlet for guiding the liquid food or beverage produced by brewing.

Thermoblocks are typically in-line heaters through which a liquid is circulated for heating. They comprise a heating chamber, such as one or more ducts, in particular made of steel, extending through a (massive) mass of metal, in particular made of aluminium, iron and/or another metal or an alloy, that has a high thermal capacity for accumulating heat energy and a high thermal conductivity for the transfer the required amount of the accumulated heat to liquid circulating therethrough whenever needed. Instead of a distinct duct, the thermoblock's duct may by a through passage that is machined or otherwise formed in the duct's body, e.g. formed during a casting step of the thermoblock's mass. When the thermoblock's mass is made of aluminium, it is preferred, for health considerations, to provide a separate duct, for example of steel, to avoid contact between circulating liquid and aluminium. The block's mass can be made of one or several assembled parts around the duct. Thermoblocks usually include one or more resistive heating elements, for instance discrete or integrated resistors, that convert electrical energy into heating energy. Such resistive heating elements are typically in or on the thermoblock's mass at a distance of more than 1 mm, in particular 2 to 50 mm or 5 to 30 mm, from the duct. The heat is supplied to the thermoblock's mass and via the mass to the circulating liquid. The heating elements may be cast or housed into the metal mass or fixed against the surface of the metal mass. The duct(s) may have a helicoidal or another arrangement along the thermoblock to maximise its/their length and heat transfer through the block.

The heating device of the invention comprises: a thermoblock with a metal mass that incorporates an inlet, an outlet and a heating chamber extending therebetween, the mass being arranged to accumulate heat and to supply heat to the liquid; and one or more electric components that are rigidly secured onto or into the thermoblock and that are connected to a printed circuit board (PCB) and/or a flex-print arranged to control such thermoblock and optionally further functions of the liquid food or beverage preparation machine. Such electric components may include sensors, thermal fuses and/or electric power components, in particular temperature sensors, flow meters, resistor heaters, ammeters and electric power regulators.

In accordance with the invention, one or more of these electric components are rigidly connected to the printed circuit board and/or flex-print (or flexible circuit), in particular via rigid connector pins or blades or rigid plug and socket members.

To reduce the number of assembly operations, in particular human interventions during the manufacturing process, the number of flexible, deformable, electric cable connections are reduced. In particular, the electric components can be rigidly connected to this printed circuit board or flex-print, for instance via rigid connector pins or blades or rigid plug and socket members. Possibly, the electric components are present the form of in integrated components on a printed circuit board or flex-print that is secured to the thermoblock and comes with these electric components into contact with the thermoblock's metal mass. In such a way, the electric components, in particular those which come into contact with the liquid circulation system such as the heating resistor(s), can be mounted automatically on the printed circuit board or the flex-print, and then the board or flex-print with its electric components is assembled (for instance clipped or glued) automatically onto the liquid circulation system without using any flexible, deformable electric connectors (e.g. cables) between the board or flex-print and the liquid circulation system. Alternatively, the electric components may be automatically mounted in a first step at dedicated locations of the liquid circulation system and then, in a second step, the printed circuit board or flex-print is assembled, for instance via an appropriate connector, to the electric components. It is also possible to assemble by welding the electric components to the liquid circulation system, in particular to the thermoblock and/or to the printed circuit board or flex-print. As mentioned, it is possible to provide some of these electric components as integrated components in the printed circuit board or flex-print, such as a heating resistive film formed on the surface of a printed circuit board or flex-print and applied directly against the surface of the thermoblock's metal mass.

In one embodiment, such an electric component is secured in a cavity of the thermoblock's metal mass. Optionally, the component is secured in the cavity by means of a biased spring element in the cavity or the cavity forms a socket for a plug comprising the component. Electric components may also be cast into the metal mass or glued into or onto the metal mass, or attached by any other suitable means together with the metal mass, e.g. screwing, force fitting, welding, etc.

Such electric component may include a power component, such as a resistor heater and/or a power switch, which is rigidly connected via a rigid electric power pin and a rigid power connector that has a socket for receiving the rigid electric pin. The rigid connector can be resilient, in particular made of one or more spring blades, to allow small displacements of the socket for self-positioning the socket around the pin and to secure electric contact between the pin and the connector.

The printed circuit board may be contained in a thermal and electric insulating housing, such as a plastic housing, that is mechanically connected to the thermoblock, in particular via snaps. Preferably, the housing is substantially impervious to protect the board against liquids and vapours in the machine. The printed circuit board may have one or more openings for the passage of the electrical connectors for connecting to the printed circuit board such electric components that are rigidly secured on or in the metal mass.

The flex-print may be secured, typically glued, to a surface of the thermoblock, in particular to its metal mass. The flex-print can have: an inner side that faces the thermoblock or metal mass and that incorporates a resistor heater in the form of a heating foil or film; and an outer side to which one or more electric components are optionally rigidly secured. Alternatively, the flex-print may incorporate on the inner side one or more electric components, in particular discrete components, such as resistor heaters, sensors and/or power switches, e.g. triacs, that are rigidly secured into and/or onto to the metal mass, and/or one or more components on the other side of the flex-print, for example a controller, a clock element and an interface connector for other electric devices of the liquid food or beverage preparation machines, such as a pump, electrovalve, user interface, level detector in a liquid reservoir or used ingredient collector, etc.

The electric components may be discrete components and/or integrated components, for instance formed directly into the flex-print and secured with the flex-print directly onto the thermoblock or its metal mass. Typically, thermal fuses, heating resistors and temperature sensors may be formed in flex-print technology.

Generally speaking, the printed circuit board as well as the flex-print can be arranged to control the thermoblock and optionally further functions in a liquid food or beverage preparation machine, of the type mentioned above by way of example.

The heating chamber in the metal mass is usually elongated, e.g. forms a duct, along a direction of flow of liquid through the mass. The heating chamber may comprise an upper flow portion followed by a down-coming flow portion, for example portions of a generally helical duct which extend helically along a horizontal or non-vertical inclined axis. Such upper flow and down-coming flow portions may have a narrowed cross-section for promoting an increased velocity of liquid therealong to inhibit an accumulation of bubbles in such an upper flow portion by pushing them down the down-coming flow portion by the flow of liquid with increased velocity. In this configuration, the elongated chamber is arranged so that the size of its cross-section changes along the chamber, to increase the flow velocity in areas, usually upper areas, which might otherwise serve to capture bubbles, in particular vapour bubbles. The increased liquid velocity in these areas "washes" the bubbles down and away from these areas with the fast flow of liquid in these areas. To avoid overheating in such areas with reduced cross-section, the heating power may be reduced on the corresponding parts of the heater, for instance, by adjusting the resistive means on these parts.

Another aspect of the invention relates to a liquid food or beverage preparation machine. This machine comprises: a brewing chamber for brewing a food or beverage ingredient by circulating heated liquid therethrough; and an in-line heating device with a thermoblock having a metal mass, as described above, for heating and supplying circulating liquid to the brewing chamber. The brewing chamber may be a capsule or pod housing for receiving an ingredient supplied within a capsule or pod into the brewing chamber.

Typically, the metal mass' inlet, outlet and heating chamber form together a rigid passage, in particular a rigid free-flow passage, for guiding the liquid circulating through the mass.

The thermoblock itself may incorporate an upstream part of the brewing chamber, the upstream part being formed by or rigidly anchored in the metal mass so that the rigid passage, in particular the rigid free-flow passage, of the metal mass extends into the brewing chamber. Furthermore, the machine usually includes a downstream part having a liquid food or beverage outlet and cooperating with the upstream part to form the brewing chamber. The downstream part and the upstream part may be movable apart and movable together for the supply into the brewing chamber and the evacuation from the brewing chamber of said ingredient. For instance, the upstream part and the metal mass are fixed, the downstream part being movable to and from the upstream part. Alternatively, the upstream part and the metal mass can be movable en bloc to and from the downstream part, the downstream part being fixed or movable in said machine.

Hence, the heating device of the invention may be used in connection with brewing chambers of the type disclosed in EP 1 646 305 or in EP 07117853.7 (NO8405).

A further aspect of the invention relates to a liquid food of beverage preparation machine, in particular as described above. The machine comprises: an electric supply circuit connectable to an electric power source; a heater powered by the electric supply circuit; and a thermal fuse device in thermal communication with the heater and associated with the electric supply circuit. The fuse device is arranged to interrupt the electric supply circuit from the power source when the heater exceeds a temperature limit.

In accordance with the invention, the thermal fuse device is reversible and comprises a switch for automatically interrupting the electric supply circuit when the heater exceeds this temperature limit. The switch is operable by a user to close the electric supply circuit when the heater has a temperature that has returned below said temperature limit. Typically, the fuse device comprises an actuator that is arranged to push out a pin, rod or piston against the user switch when this temperature limit is exceeded by the heater so as to actuate the user switch and open the circuit.

This beverage or liquid food machine may include any of the above disclosed features or combination of features.

The fuse device may have an actuator which comprises a thermo-mechanical component that is in thermal communication with the heater and that mechanically actuates the user switch to open the electric supply circuit when the heater exceeds the temperature limit. The thermo mechanical component comprises in particular a shape memory element or a bimetal element.

The fuse device can include a safety electric temperature sensor in thermal communication with the heater and an electromechanical actuator that actuates the user switch to open the electric supply circuit when the safety sensor is exposed to a temperature generated by the heater which exceeds the temperature limit.

In one embodiment, the beverage or liquid food machine has a printed circuit board with a control circuit for controlling the heater and optionally further functions of the machine, such as a pump or an electric interface, the printed circuit board further including a safety circuit that is electrically separated on the printed circuit board from the control circuit, the safety circuit being connected to the safety sensor, in particular rigidly connected to the safety sensor, and arranged to control the electromechanical actuator.

At least part of the fuse device, in particular the actuator, electromechanical or thermo-mechanical actuator, the user switch and/or, when present, the safety sensor, may be rigidly connected to a printed circuit board of the liquid food or beverage machine, optionally on a part that is electrically insulated from an ordinary control unit of the machine, e.g. a unit for controlling the usual operations of the machine such as beverage or liquid food dispensing, self-cleaning, user-interface, etc. Hence, assembly and integration and safety of the fuse device into the liquid food and beverage machine is improved.

Yet another aspect of the invention relates to a liquid food of beverage preparation machine, in particular as above. The machine comprises a fluid arrangement and a printed circuit board, in particular a printed circuit board bearing a control unit for controlling one or more functions of the fluid arrangement. Typically the functions may involve the use of a pump or a heater, such as the above discussed thermoblock, as well as sensors, detectors and a user-interface for a user-control of the fluid arrangement.

This printed circuit board is enclosed within a substantially impervious housing to protect the printed circuit board from fluid and/or vapor emissions from the fluid arrangement.

This beverage or liquid food machine may include any of the above disclosed features or combination of features.

In yet a further aspect of the invention, a printed circuit board or flex-print for a beverage preparation machine, for instance as described above, is rigidly connected to a flow meter, in particular a magnetic flow meter. The flow meter may comprise: a magnetic field detector, such as a hall sensor, that is incorporated into the printed circuit board or flex-print and a rotatable magnetic helix or turbine which is located within a duct or pipe that is arranged for circulating liquid therein and that is rigidly secured to the printed circuit board or flex-print.

By avoiding the use of flexible, deformable cables, the number of operations during the assembly process of a liquid food and beverage preparation machine is reduced, in particular the number of human interventions is reduced. Hence, the manufacturing and assembly costs are correspondingly reduced as well as the risks of failure due to human error. By avoiding flexible and deformable cable connections, automation of the assembly may be increased.

BRIEF DESCRIPTION OF THE DRAWINGS

The invention will now be described with reference to the schematic drawings, wherein.

DETAILED DESCRIPTION OF THE INVENTION

In particular, the invention relates to a liquid food of beverage preparation machine comprising: an electric supply circuit connectable to an electric power source; a heater powered by the electric supply circuit; and a thermal fuse device in thermal communication with the heater and associated with the electric supply circuit, the fuse device being arranged to interrupt the electric supply circuit from the power source when the heater exceeds a temperature limit. Preferably, the thermal fuse device is reversible and comprises a switch for automatically interrupting the electric supply circuit when the heater exceeds the temperature limit, the switch being operable by a user to close the electric supply circuit when the heater has a temperature that has returned below the temperature limit.

In another embodiment, the invention relates to a liquid food or beverage preparation machine comprising a fluid arrangement and a printed circuit board for controlling one or more functions of the fluid arrangement, with the printed circuit board being enclosed within a substantially impervious housing to protect the printed circuit board from fluid or vapor emissions from the fluid arrangement.

In yet another embodiment, the invention relates to a combination of a flow meter and printed circuit board or flex-print for a liquid food or a beverage preparation machine, which board or flex-print is rigidly connected to the flow meter.

These embodiments can be used alone or in combination in in a liquid food or a beverage preparation machine that includes a heating device comprising: a thermoblock with a metal mass that incorporates an inlet, an outlet and a heating chamber extending therebetween to form a passage for guiding the liquid circulating through the mass, the mass being arranged to accumulate heat and to supply heat to the liquid; and one or more electric components rigidly secured onto or into the thermoblock, electrically connected to the printed circuit board or a flex-print, and arranged to control the thermoblock and optionally further functions of the liquid food or beverage preparation machine. Preferably, the one or more electric components are rigidly connected to a printed circuit board that operates the machine.

Figure 1:
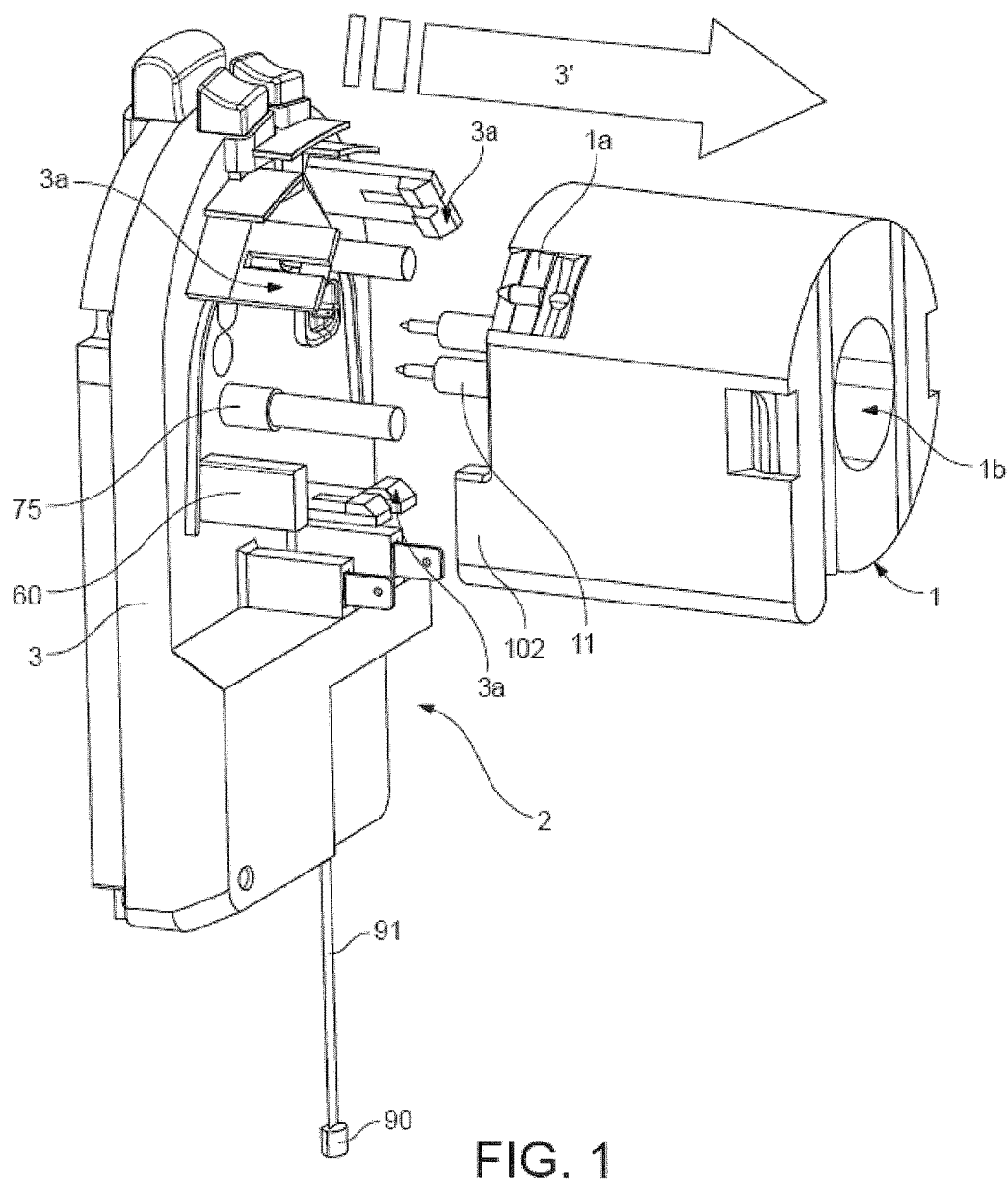
FIG. 1 shows a heating device incorporating a thermoblock and a printed circuit board in its housing according to the invention.

FIG. 1 shows an exploded view of a heating device of a liquid food or beverage preparation machine, in which liquid is circulated through a thermoblock and then guided into a brewing chamber for brewing a food or beverage ingredient supplied into the brewing chamber. For instance, a beverage ingredient is supplied to the machine in prepackaged form, for example contained in a capsule or in a pod. Typically, this type of liquid food or beverage machine is suitable to prepare coffee, tea and/or other hot beverages or even soups and like food preparations. The pressure of the liquid circulated to the brewing chamber may for instance reach about 10 to 20 atm.

Figure 2:
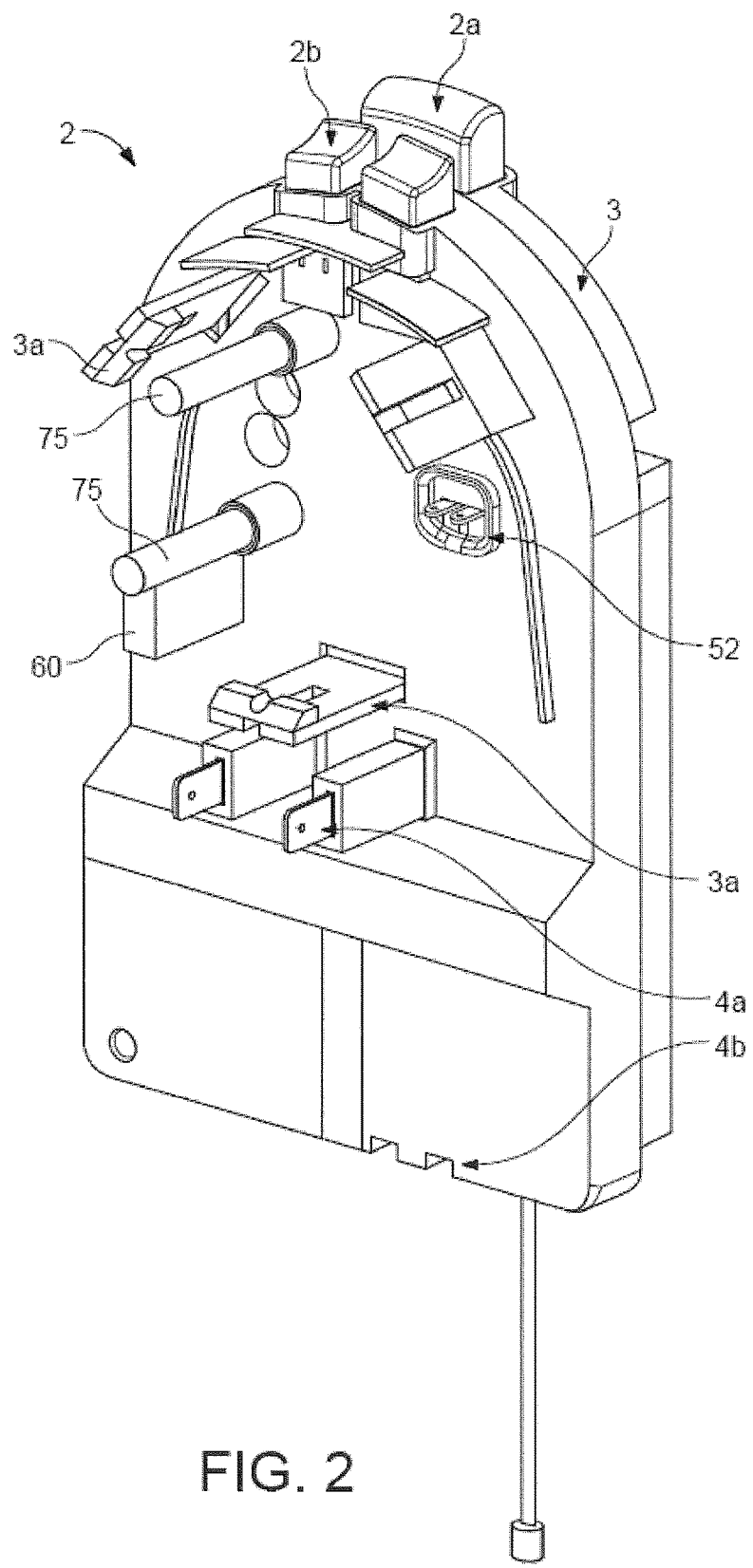
FIGS. 2 and 3 show further details of the same printed circuit board in its housing.
Figure 3:
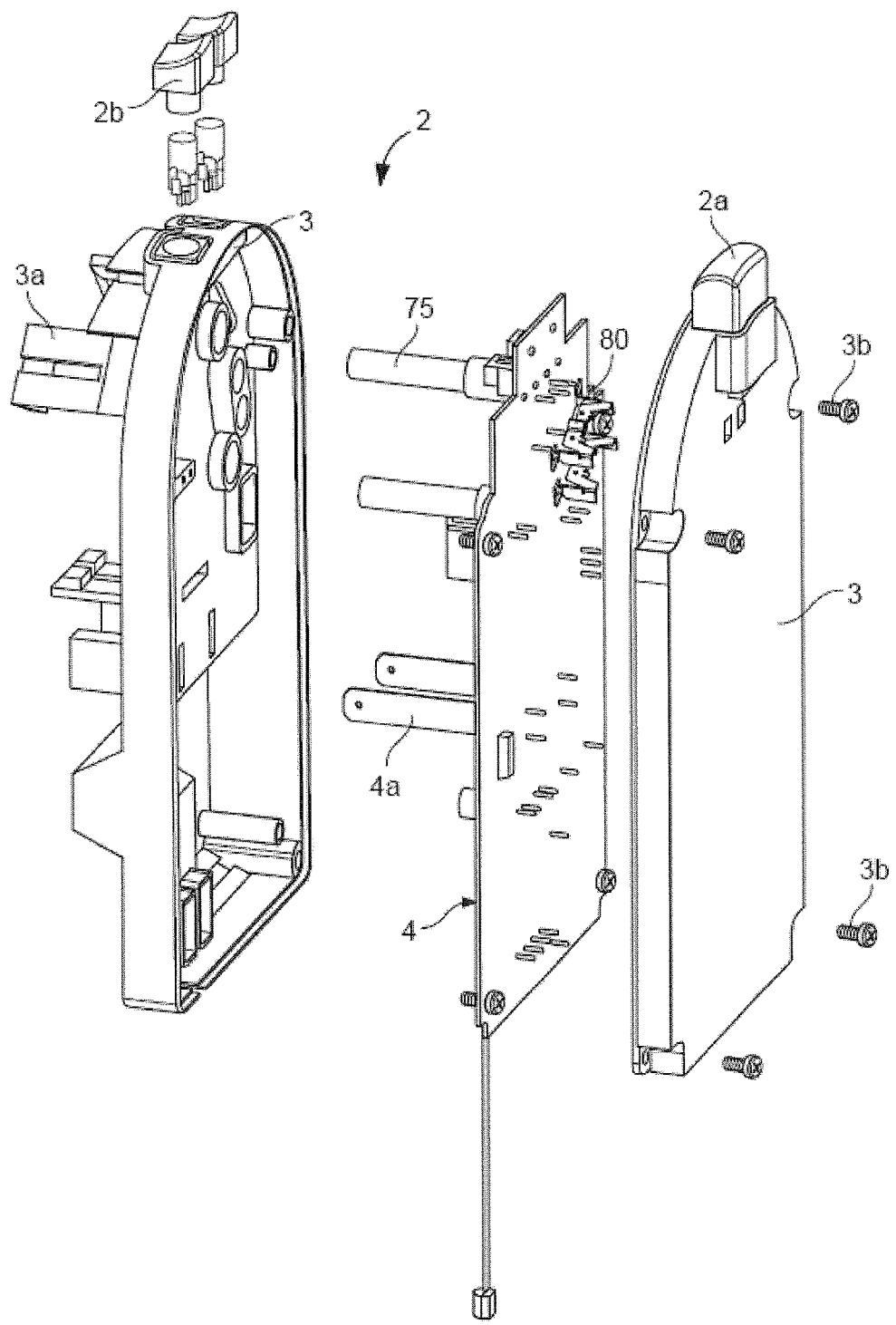

The heating device incorporates a thermoblock and a printed circuit board according to the invention. FIGS. 2 and 3 show further details of the printed circuited board 4 in its housing 3 of the heating device of FIG. 1.

The heating device shown in FIGS. 1 to 3 has a thermoblock with an aluminium metal mass 1 and a functional block 2 including a thermal and electrically insulating plastic housing 3 containing a printed circuit board 4.

Metal mass 1 incorporates a water inlet, a water outlet and a water heating duct extending therebetween to form a rigid free-flow passage (not shown) for guiding water circulating from a water reservoir via a pump through metal mass 1.

As mentioned above, the heating duct may comprise an upper flow portion followed by a down-coming flow portion, for example portions of a generally helical duct which extends along a horizontal or non-vertical inclined axis. Such upper flow and down-coming flow portions may have a narrowed cross-section for promoting an increased velocity of water therealong to inhibit an accumulation of bubbles in such upper flow portion by pushing them down the down-coming flow portion by the flow of water with increased velocity. In this configuration, the duct is arranged so that the size of its cross-section changes along the chamber, to increase the flow velocity in areas, usually upper areas, which might otherwise serve to capture bubbles, in particular vapour bubbles. The increased liquid velocity in these areas "washes" all possible bubbles away from these areas with the fast flow of liquid in these areas. To avoid overheating in such areas with reduced cross-section, the heating power may be reduced on the corresponding parts of the heater, for instance, by adjusting the resistive means on these parts.

In a variation, this duct has a reduced cross-section along its entire length to provide a sufficient velocity of the water flow for flushing possible vapour bubbles formed therein during heating.

Metal mass 1 of thermoblock further includes an opening 1*b* which forms or rigidly anchors an upstream part of the brewing chamber (not shown) so that the rigid passage of metal mass 1 extends into the brewing chamber. The liquid food or beverage preparation machine also comprises a downstream part (not shown) having a liquid food or beverage outlet and cooperating with the upstream part to form the brewing chamber, the downstream part and the upstream part can be movable apart and movable together for the supply into the brewing chamber and the evacuation from the brewing chamber of the ingredient.

Typically, the upstream part of the brewing chamber integrated into the thermoblock, will be fixed in the liquid food or beverage preparation machine and the downstream part of the brewing chamber will be movable. The brewing chamber may have a generally horizontal orientation, i.e. such a configuration and orientation that the water flows through the food or beverage ingredient in the brewing chamber along a generally horizontal direction, and the upstream part and/or downstream part may be movable in the same or in the opposite direction of the water flow in the chamber. Embodiments of such a thermoblock and brewing chamber are for example disclosed in EP 07117853.7 (NO8405), the content of which is hereby incorporated by way of reference.

Functional block 2 is secured to metal mass 1 via snaps 3*a* of housing 3 that cooperate with corresponding recesses 1*a* in the surface of metal mass 1 when housing 3 is assembled to metal mass 1 in the direction of arrow 3'.

The two part housing 3 of functional block 2 encloses printed circuit board 4 on all sides, in particular in a substantially impervious manner so as to protect board 4 against liquid and vapours in the machine. The two parts of housing 3 may be assembled by screws 3*b* or any other appropriate assembly means, such as rivets, gluing, welding, etc. Functional block 2 includes a user interface with a master switch 2*a* and two control switches 2*b* that are connected via housing 3 to printed circuit board 4. It is of course possible to use more elaborated user interfaces including screens or touch screens. Printed circuit board 4 includes power connectors 80 for supplying electric heating power to metal mass 1 via power pins 11 extending through corresponding openings in housing 3, further electrical connectors 4*a* for one or more further electric devices in the liquid food or beverage preparation machine, such as a user interface, pump, fan, valve, liquid cooling element, etc. as required, and a connector 4*b* to the mains for the central electric power supply.

The thermoblock includes electric components, namely a temperature sensor 70 connected to plug member 52, thermal fuses 75, a power switch in the form of a triac 60 in a cavity the opening of which is formed between protruding walls 102 and a heating resistor (not shown) with connector pins 11, that are rigidly secured into metal mass 1 and rigidly connected to printed circuit board 4, as will be explained in greater details below in connection with FIGS. 5 to 12*b*. Furthermore, printed circuit board 4 is electrically connected via a rigid connector or cable 91 to a hall sensor 90 of a flow meter that is located on the water circuit of the beverage preparation machine, typically between a pump and a water or other liquid source such as a water or liquid reservoir, or between a pump and a heating device, or within the heating device.

Moreover, printed circuit board 4 may carry a microcontroller or processor and possibly a quartz clock for controlling the intensity of current passed to resistive heating element based on the flow rate of the circulating water measured with the flow meter and the temperature of the heated water measured with the temperature sensor. To increase the accuracy of the temperature control, one or more temperature sensors may be incorporated into metal mass 1 and/or into the brewing chamber and/or upstream the metal mass 1 or at its water inlet. The controller or processor may also control further functions of the liquid food or beverage preparation machine, such as a pump, a liquid level detector in a water supply reservoir, a valve, a user interface, a power management arrangement, an automatic beverage ingredient supplier such as an integrated coffee grinder or an automatic supplier of ingredient capsules or pods, etc.

Figure 4:
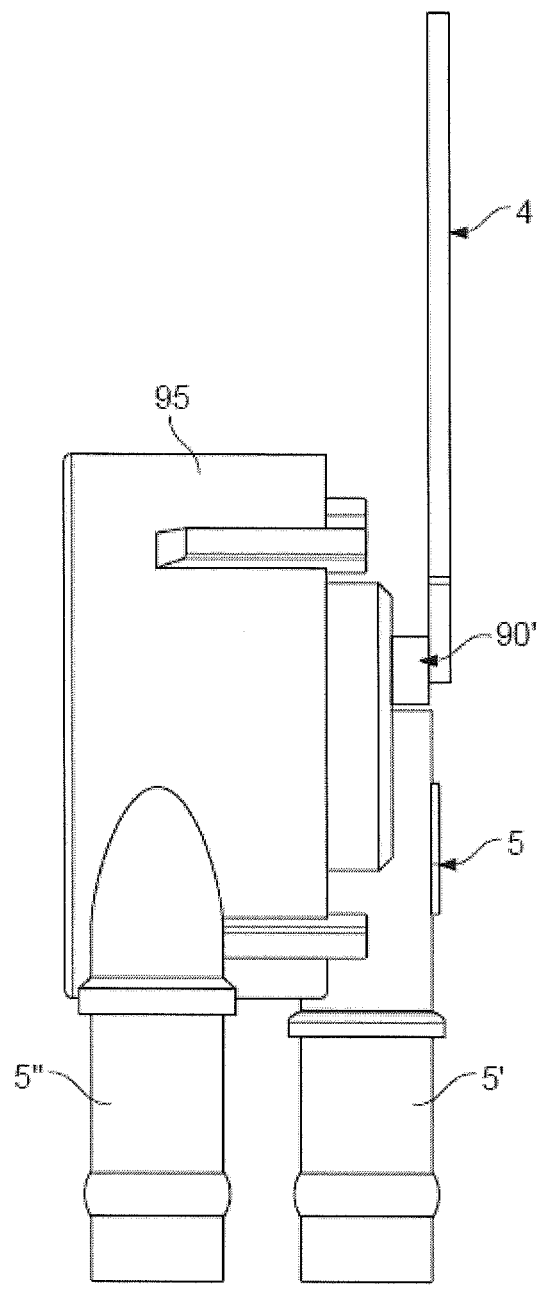
FIG. 4 shows a printed circuit board with a flow meter in accordance with the invention.

FIG. 4 illustrates another embodiment according to the invention of a flow meter 95 for a liquid food or beverage preparation machine according to the invention. Flow meter 95 includes a hall sensor 90' that is incorporated onto printed circuit board 4 as an integrated component of the printed circuit board 4 or as a discrete component rigidly mounted or connected thereto, typically by welding. Flow meter 95 is also integrated in the water circulation circuit 5 and is connected to a water incoming pipe 5' and a water outgoing pipe 5" and to the printed circuit board 4 via hall sensor 90'. Water pipes 5',5" may be flexible, e.g. made of silicon, or rigid to facilitate automatic assembly. Flow meter 95 includes a internal magnetic helix or rotor (not shown) through which water is circulated. The water flow drives within flow meter 95 the magnetic helix or rotor in rotation at an angular speed that is proportional to the velocity of the flow of water thereby causing a corresponding rotation of the magnetic field generated by the magnetic helix or rotor, which is detected by hall sensor 90' and converted into a corresponding electric signal on printed circuit board 4.

By providing flow meter 95 with hall sensor 90' directly on printed circuit board 4, the corresponding manufacturing steps of the liquid food or beverage preparation machine do not require human intervention, less components, in particular no separate connector link, in particular no electric cable, and thus reduces the production costs of the assembly of the liquid food or beverage preparation machine as well as its reliability since fewer parts are involved and the human factor is also reduced.

During use, a liquid to be heated is circulated, for instance by using a pump, via flow meter 90,90',91,95 and then freely through the inlet of metal mass 1, through the heating duct and through the outlet of mass 1 into brewing chamber for brewing the ingredient contained therein. The controller on printed circuit board 4 is arranged to control triac 60 for adjusting the heating current passed via power pins 11 to heating resistor in metal mass 1, based on measures of the liquid flow by means of flow-meter 90,90',91,95 and of the temperature of the heated liquid by means of temperature sensor 70 connected to plug member 52.

Figure 5:
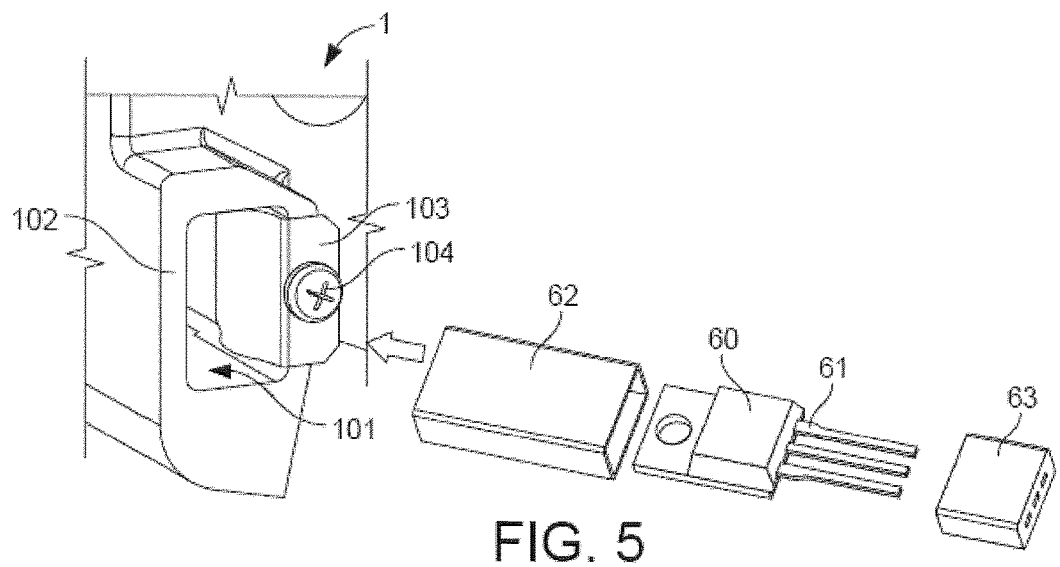
FIGS. 5 and 6 show the assembly of an electric power component to a metal mass of a thermoblock and to a printed circuit board in accordance with the invention.
Figure 6:
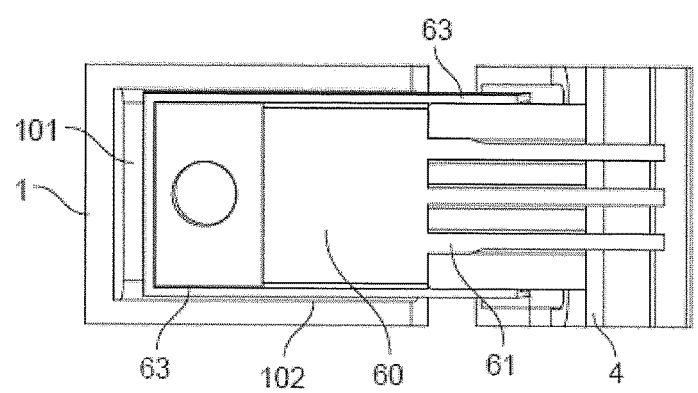

FIGS. 5 and 6, in which the same numeric references designate the same elements, illustrate in greater detail the rigid assembly of a discrete power component in the form of a triac 60 to metal mass 1 and to a printed circuit board 4 according to the invention. Whereas FIG. 5 shows the assembly in an exploded perspective view, FIG. 6 discloses the assembly in cross-section.

Metal mass 1, a part of which is shown in FIGS. 5 and 6, has a recess 101 for receiving power component 60. Recess 101, the opening of which is formed between protruding walls 102, is associated with a spring element 103, for example in the shape of a spring leaf, assembled to metal mass 1, e.g. via a screw 104. Other spring and assembly systems may of course be used, for example, the spring leaf may be integral with metal mass 1 or welded thereto so as to reduce the number of parts. Spring element 103 urges power component 60 against walls 102 of recess 101 in metal mass 1 when component 60 is inserted into recess 101, to secure component 60 in mass 1 and provide an optimal contact between mass 1 and component 60.

Power component 60 has one or more rigid electrical connector pins 61, for instance three pins for the triac shown in FIGS. 5 and 6, which are rigidly connected to printed circuit board 4. Furthermore, power component 60 is covered with an optional cap 62, e.g. made of silicon, that may assist fixation of the power component 60 in recess 101, as well as an optional non conductive sleeve 63 around its connector pins 61 which spaces the main body of power component 60 from printed circuit board 4 and protect pins 61 against the environment. Moreover, cap 62 and sleeve 63 provide an electric insulation around power component 60.

Hence, metal mass 1 serves as a heat sinker for power component 60 by evacuating, via mass 1 and optionally via the water circulating through mass 1, heat generated by the power component during use. For this purpose, mass 1 is configured and made of a metal, such as aluminium or steel, that allows optimal evacuation of heat from the power component along the heat evacuation path through mass 1.

Power component 60 may be a switch or regulating element, e.g. a triac as mentioned above, for adjusting the required electric power that is supplied to the resistive means, e.g. a heating resistor, for generating the desired heat in metal mass 1 in order to heat the circulating water to the appropriate temperature.

Figure 7:
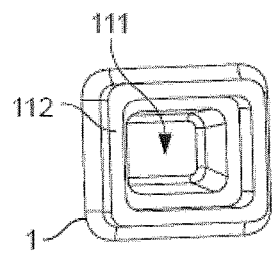
FIGS. 7 to 9 show the assembly of a sensor to a metal mass of a thermoblock and to a printed circuit board in accordance with the invention.
Figure 8:
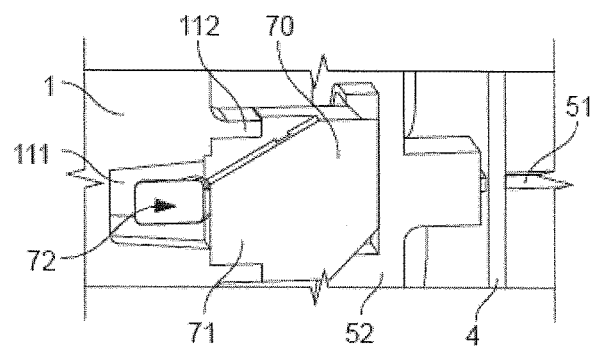
Figure 9:
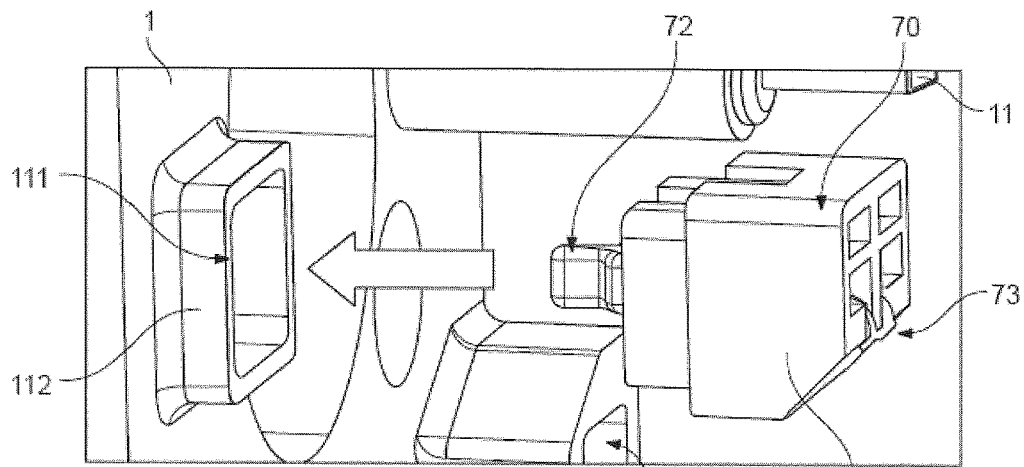

FIGS. 7 to 9, in which the same numeric references designate the same elements, illustrate the rigid assembly of a discrete electronic component 70 into metal mass 1 and to a printed circuit board 4. This electronic component may be a sensor such as a temperature sensor, a flow meter, a thermal fuse or another similar component, such as an ammeter for providing a feedback of the current passed through the resistive heating means, e.g. heating resistor. For the purpose of illustration, a thermal sensor 70 for the control of heating electric current passed to the heating resistor via pins 11 and adjustment of the heat generated in metal mass 1 is disclosed. Thermal sensor 70 may for example be located at the inlet or outlet of metal mass 1 or thereinbetween. Several thermal sensors may be used to allow a more precise control of the heating of the water passed via metal mass 1.

Metal mass 1, a part or which is shown in FIGS. 7 to 9, has a recess 111 for receiving the electronic component 70. Recess 111 is formed between protruding walls 112 and extends below the surface of metal mass 1.

Sensor 70 has a connector socket 71 through which a sensor element 72 is joined to electric flat connectors 73 on the opposite side of socket 71. The sensor's connection pins 73 are brought into contact with flat connector pins 51, one of which is shown in FIG. 8, of printed circuit board 4. Pins 51 extend through a plug member 52 of board 4 into socket 71 for contacting the corresponding connection pins 73 of sensor 70. When connector socket 71 is urged between walls 112 of body 1, sensor element 72 is located in recess 111 of metal mass 1. As shown in FIG. 2, plug member 52 extends through housing 3 via a corresponding opening. Alternatively, plug member 52 may be integral with housing 3 and electrically connected to printed circuit board 4.

When sensor 70 is a temperature sensor, the electric characteristics of sensor element 72 will depend on the temperature in recess 111, which will be used for evaluating the temperature of metal mass 1 at this location and optionally also the temperature of water circulating in metal mass 1 in an indirect evaluation process.

Sensor element 72 may for instance be an NTC (negative temperature coefficient) resistor or a PTC (positive temperature coefficient) resistor.

Such a sensor configuration permits reliably measuring the temperature in the corresponding location of the heater, fast reaction (low inertia) and provides an excellent and reliable electric contact system.

Sensor 70 may be preassembled into socket 71, for instance made of thermoplastic material, and assembled into metal mass 1 and to printed circuit board 4 in a fully automatic process. Sensor 70 may be glued into metal mass 1 using for example an epoxy compound. The preassembled sensor 70 may then be connected by pressing the socket's flat connectors 73 into connection slots of socket 71 in such a way as to be connected to sensor element 72. Printed circuit board 4 is then mounted with housing 3 onto socket 70 via plug 52 and connector pins 51.

It follows that the assembly of thermoblock with metal mass 1 and printed circuit board 4 does not require handling any flexible parts and thus the assembly can be carried out automatically without the need of any human intervention. Furthermore, the assembly of sensor 70 itself only requires low cost components. Hence, the assembly of sensor 70 on metal mass 1 and its connection to printed circuit board 4 leads to significant cost savings.

Figure 10:
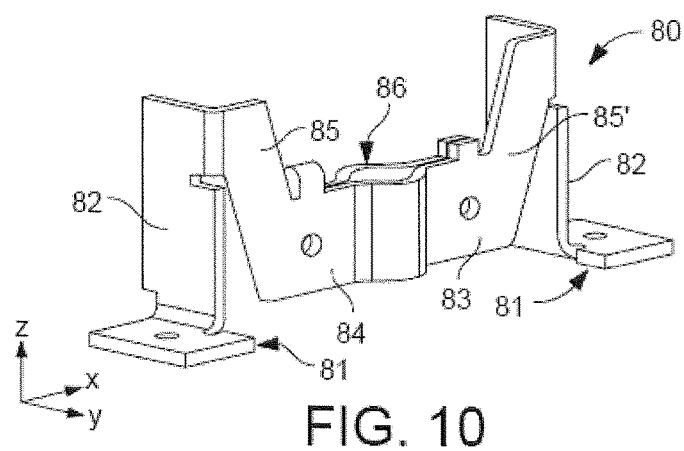
FIG. 10 shows an electric power connection between a power component in the metal mass and a printed circuit board of a thermoblock in accordance with the invention.

FIG. 10 is a perspective view in an xyz orthogonal referential, as indicated by the corresponding arrows associated with FIGS. 10 to 12b, of a self-positioning rigid electric power connector 80 for connecting a heating resistor to a printed circuit board 4 and for carrying electric heating current thereto or therefrom. FIGS. 11a and 11b on the one hand, and FIGS. 12a and 12b on the other hand, schematically show the self-positioning of power connector 80 in the y direction and the x direction, respectively.

Power connector 80 is typically metal-based, and may in particular contain steel, aluminium and/or copper alloys that provide sufficient electric conductivity, mechanical resistance and resilience.

Power connector 80 extends between a pair of flat feet 81 for connection to a printed circuit board 4. Each foot 81 is connected to a bottom part of a flat generally upright spring member 82. The upper parts of the upright spring blades 82 are connected together via a transverse spring member 83 that comprises a flat central horizontal part 84 inbetween a pair of inclined intermediate parts 85,85'. Upright members 82, intermediate part 84 and inclined parts 85,85' of transverse member 83 are in a general M arrangement on the pair of feet 81. Transverse member 83 further includes a socket 86 with a through-passage for securing therethrough an electric connector pin 11 extending from metal mass 1.

In FIGS. 11a, 11b, 12a and 12b, in which the same numeric references designate the same elements, a power connector 80 is schematically shown assembled via a power pin 11 to a heating resistor (not shown) in metal mass 1. Power pin 11 extends upright from the surface of metal mass 11 and is secured in the through-passage of socket 86 of transverse member 83. To simplify the illustration, housing 3, as shown in FIGS. 1 to 3, extending between printed circuit board 4 and metal mass 1, is not shown in FIGS. 11a to 12b.

Feet 81 of power connector 80 are electrically connected and secured onto printed circuit board 4, for instance by rivets or welding 81' or any other suitable assembly means. Metal mass 1 faces printed circuit board 4 so that power pin 11 extends through corresponding holes in housing 3 and through board 4 via a through-opening 55 in board 4 to the other side of board 4 and is then secured in through-passage 86 of power connector 80. Continuous electrical connection between power pin 11 and transverse member 83 may be achieved by force-fitting or welding pin 11 in through-passage 86.

Power connector 80 allows for small positioning displacements of through-passage 86 in the x direction and y direction, with reference to the xyz referential associated with FIGS. 10 to 12b. Different directions of displacements are provided by the different orientations, in particular perpendicular orientations, of the resilient spring blade members 82,83, which permit displacements along corresponding directions.

Figure 11A:
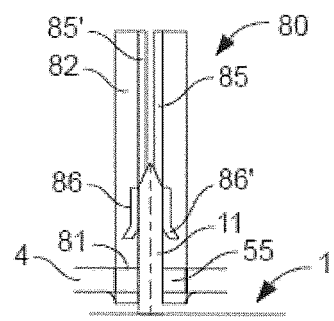
FIGS. 11*a* and 11*b* illustrate a deflection according to a first direction of the power connection shown in FIG. 10.
Figure 11B:
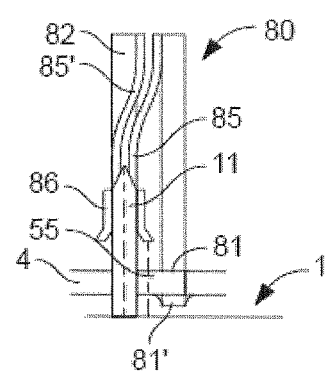
Figure 12A:
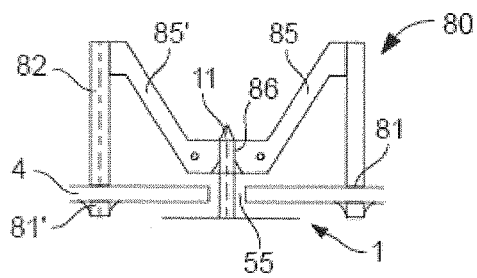
FIGS. 12*a* and 12*b* illustrate a deflection according to a second direction of the power connection shown in FIG. 10.
Figure 12B:
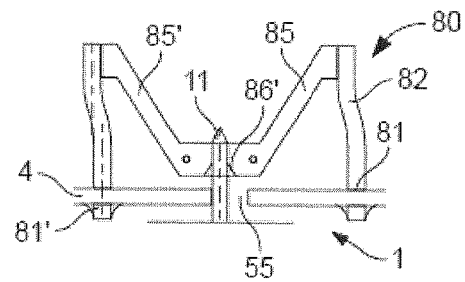

FIGS. 11a and 11b, on the one hand, and FIGS. 12a and 12b, on the other hand, show a displacement of the connector's socket 86 assembled to power pin 11 along the y direction and the x direction respectively. Displacement of socket 86 in the x and y directions is achieved by a small flexion of upright spring blades 82 and a small flexion of inclined intermediate parts 85,85', respectively.

FIGS. 11a and 12a show power pin 11 extending right through the middle of through-opening 55, and through the through-passage of socket 86 which all extend along substantially the same axis. In this configuration, power pin 11 is positioned in line with power connector 80 which is thus not subjected to any displacement flexion stress in its upright spring blades 82 and inclined intermediate parts 85,85'.

In contrast, FIGS. 11b and 12b show power pin 11 extending eccentrically through through-opening 55. Through-passage of socket 86 aligned to power pin 11 is equally eccentric with respect to through-opening 55. In this case, printed circuit board 4 is not perfectly aligned with power pin 11 of the heater and power connector 80 self-adapts the position of its through-passage in socket 86 to match precisely the position of pin 11 by flexion of its upright spring blades 82 in the x direction, as shown in FIG. 12b, or by flexion of its transverse spring member 83 in the y direction, as shown in FIG. 11b. In order to facilitate insertion of power pin 11 into through-passage of socket 86, the lower part 86' of socket 86 has a generally funnel-like or frusto-conical shape that is arranged to receive a generally conical upper end of power pin 11.

The displacement of socket 86 to adapt to the position of power pin 11 may result from discrepancies, e.g. manufacturing tolerances or different temperature-related dilatation mechanisms, between the relative positioning of a pair of power connectors 80 on printed circuit board 4 with respect to the relative positioning of a corresponding pair of power pins 11 on the metal mass. Furthermore, the relative position of other electrical components that are rigidly connected to the printed circuit board and fixed parts of the beverage preparation machine, in particular the metal mass, for example temperature sensors and power regulator or switches, e.g. like the ones shown in FIGS. 5 to 9, may induce displacements at the level of the power connection.

During use, the passage of current from and back to printed circuit board 4 via first power connector 80, first power pin 11, the heating resistor (not shown) in metal mass 1, the second power pin 11, the second power connector 80, is controlled by a power switch or regulator, e.g. a triac 60, for instance as illustrated in FIGS. 5 and 6.

FIGS. 11a and 11b also illustrate how an error of relative positioning of feet 81 and inclined parts 85,85' on printed circuit board 4 is managed by power connector 80. As shown, feet 81 and thus inclined parts 85,85' are not perfectly aligned in the x direction but slightly off-set one to another. This off-set is however fully compensated by a corresponding resilient deflection of transverse member 83 without causing excessive stress in printed circuit board 4 or in power connector 80. Likewise, if the spacing between the two anchorage locations on printed circuit board 4 for anchoring feet 81 are greater or shorter than the spacing between feet 81 when the power connector is in a relaxed state, then a corresponding resilient deflection of members 82 can absorb such a spacing difference without excessive or detrimental stress in power connector 80 or printed circuit board 4.

Tests have shown that in the case of an M-shaped power connector of the type shown in FIGS. 10 to 12b having an overall width and height above the feet of about 1.3 cm×1 cm, made of bent blade-type conductive metal spring portions that have a cross-section of about 3 mm×0.2 mm or 0.3 mm, the positioning offset that can be tolerated and compensated in all directions while maintaining good electrical and mechanical contacts for currents above 10 amps and temperatures around 80° C., may be in the range of 3 to 8%, in particular about 5%, or 0.25 to 0.7 mm, typically around 0.4 mm.

Hence, with such power connectors allowing small displacements in one or more directions of its connection part 86 relative to its base 81 for connection to a printed circuit board 4, small position tolerances of preassembled or preformed heating element connectors can be compensated and still provide a good electrical contact performance under high current and elevated temperature conditions.

Therefore, with such a power connector 80 that self-positions its socket 86 on connector pins 11, it is possible to provide a cableless precise and continuous contact for high electrical currents, in particular between a resistive heating means on a heater and the power supply at printed circuit board 4. The absence of flexible power cables increases the integration, facilitates the manufacturing automation level of the device and reduces its production costs as well as its reliability by reducing the human factor.

Figure 13:
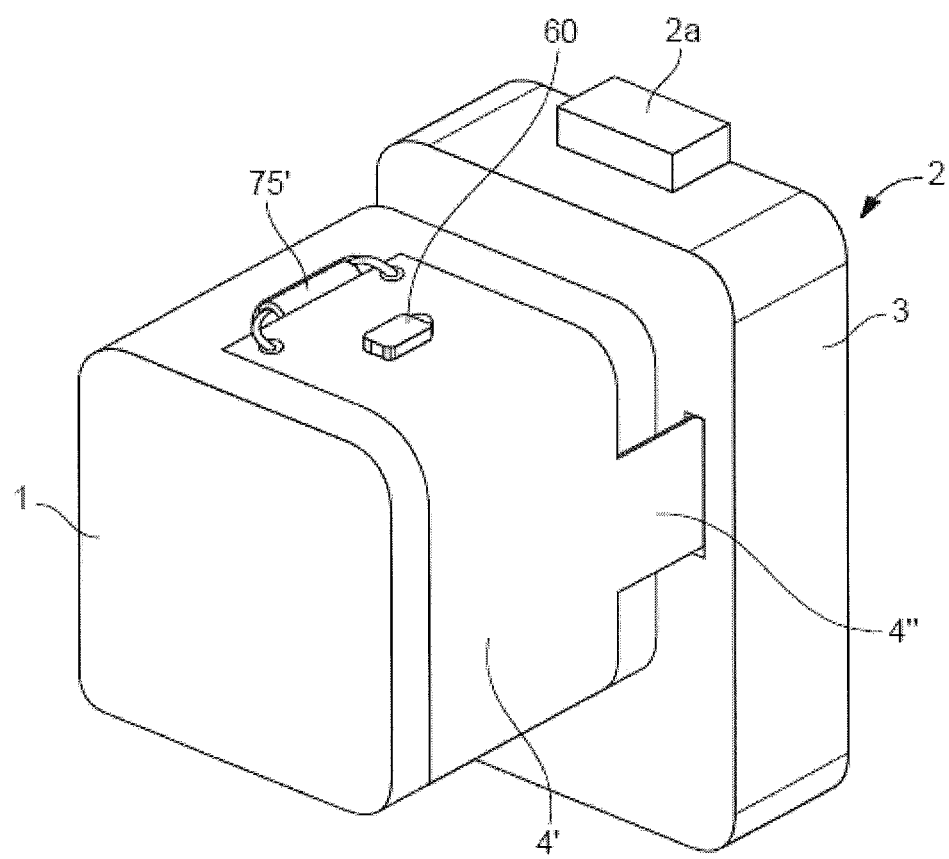
FIG. 13 shows a heating device with a thermoblock and a flex-print circuit in accordance with the invention.

FIG. 13 illustrates a variation of the heating device in accordance with the invention which includes a flex-print 4' instead of a printed circuit board.

Flex-print 4' is bonded, in particular glued, to the surface of a metal mass 1 of a thermoblock. Flex-print 4' has: an inner side applied to metal mass 1 that incorporates a resistor heater in the form of a heating foil or film. The outer side of flex-print 4' carries one or more electric components 60,75' that are rigidly secured to the outer side. Flex-print 4' may also incorporate on its inner side one or more electric components. The electric components may be integrated components or discrete components, such as resistor heaters, sensors and/or power switches, e.g. triacs, that are secured into and/or onto to the metal mass, and/or one or more components on the outer side of the flex-print, for example a controller.

As illustrate in FIG. 13, flex-print 4' is rigidly connected to a thermal fuse 75' and to a triac 60. Since the inner surface of flex-print 4' matches the surface of metal mass 1, triac 60 on the outer surface of flex-print 4' is in thermal communication with metal mass 1 via flex-print 4' so that heat generated by triac 60 during use can be well evacuated via metal mass 1 and optionally via the water circulating in mass 1. In a variation, a triac and/or other electric components, such as thermal sensors, may be rigidly connected to the inner side of flex-print to improve thermal communication between the triac and the metal mass.

Flex-print 4' is connected to functional block 2 into housing 3 via arm 4" for data and power connection. Via arm 4" flex-print 4' may be connected to a printed circuit board, for instance in housing 3, and/or to further electric devices, such as a user interface or a main switch 2a. The thermo-block with its metal mass 1 is also rigidly connected to functional block 2, for instance by means of snaps, screws, rivets, etc.

Figure 14:
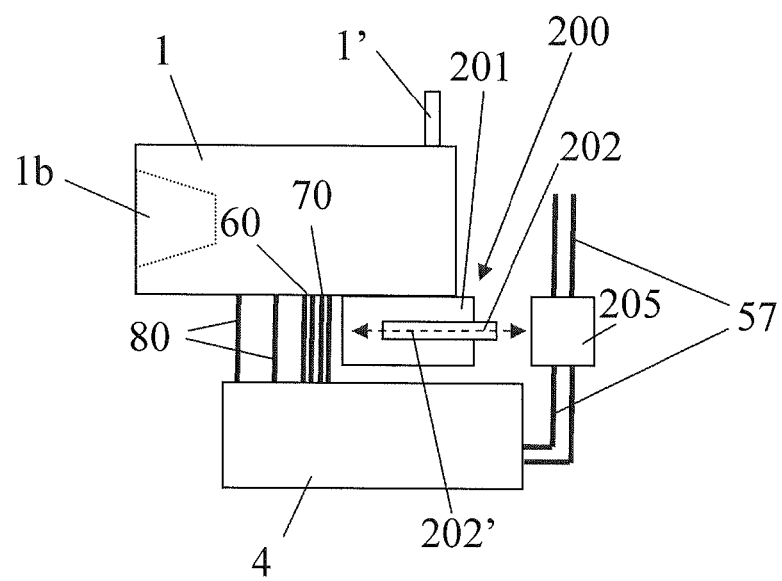
FIGS. 14 and 15 schematically illustrate two embodiments of the invention of an electric circuit of a beverage machine with a user-reversible safety fuse in accordance with the invention.
Figure 15:
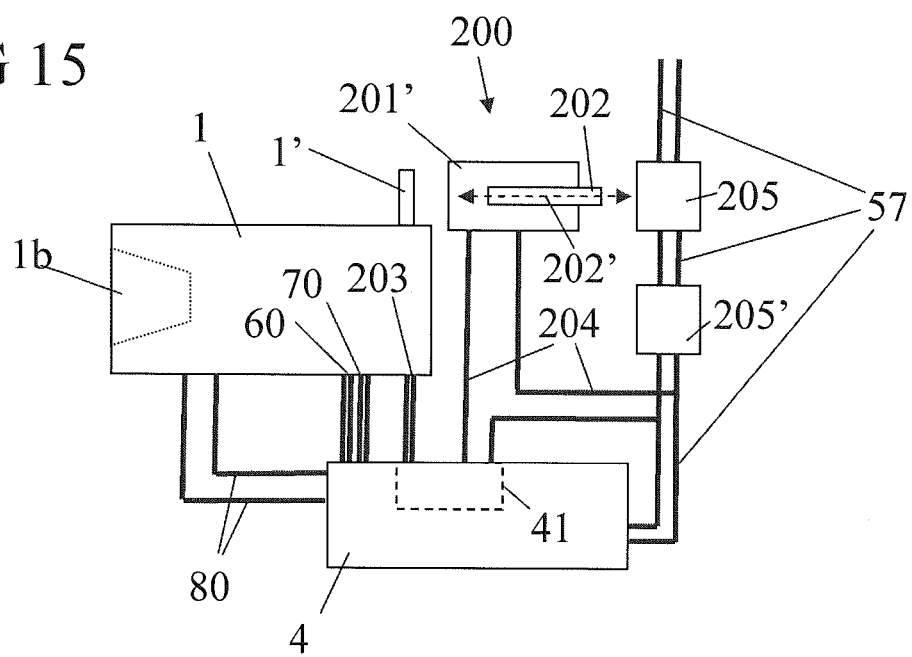

FIGS. 14 and 15, in which the same numeric references designate generally the same elements, schematically disclose two alternative embodiments of a beverage or liquid food machine with a user-reversible fuse device.

The machine according to the invention has an electric supply circuit 57 that is connectable to a power source (not shown), such as the mains or an equivalent power source. Supply circuit 57 is connected to a printed circuit board (PCB) 4 which bears the machine's control unit, e.g. a micro-controller, memory device, various interfaces to the various parts of the machine that require automatic control, such as a user-interface, a pump, a heater 1, sensors 60,70, etc. Supply circuit 57 has a main switch 205,205' allowing a user to switch on and off the beverage or liquid food machine.

In-line heater 1 has a water inlet 1' connected to a water source, in particular via a pump (not shown), and a downstream cavity 1b delimiting an upper part of a brewing unit arranged to receive a pre-packaged beverage ingredient such as a coffee or tea capsule and to cooperate with a beverage or liquid food outlet member or assembly (not shown).

Advantageously main switch 205,205' is mechanically mounted onto PCB 4 to facilitate assembly and increase integration of the system.

Furthermore, the machine includes a thermal fuse device 200 that has a switch 205 on circuit 57 and an actuator 201,201' arranged to disconnect circuit 57 by actuating switch 205 when heater 1 has a temperature that exceeds a temperature limit, e.g. a temperature limit in the range of 120° C. to 180° C., in particular 140° C. to 160° C., indicative of a malfunction of heater 1 or of its control unit 4.

Thermal fuse device 200 is user reversible. Upon safety disconnection of circuit 57 by fuse device 200, switch 205 may be operated by a user to reconnect circuit 57 and re-establish electric powering of PCB 4. Hence, if thermal fuse device 200 goes off improperly or if heater 1 merely has an accidental one time overheat condition, the liquid food or beverage machine of the invention does not need to be returned for servicing in order to replace the fuse device, unlike existing beverage or liquid food machines fitted with one-time thermal fuses.

Fuse device 200 has an actuator 201, 201' that is arranged to push out a pin, rod or piston 202 against the user switch, e.g. a switch of the push-button type, when said temperature limit is exceeded by the heater so as to actuate the user switch and open circuit 57.

The embodiment shown in FIG. 14 has a fuse device 200 with an actuator 201 including a pin 202 movable along the direction of arrow 202' and a thermo-mechanical component mounted onto heater 1 and in thermal communication therewith. The thermo-mechanical component may be any arrangement suitable to convert the passage of a temperature level into a mechanical action or displacement, such as an element made of a shape memory alloy that remembers its shape, or a bi-metallic strip element.

Hence, when heater 1 exceeds the temperature limit, the thermo-mechanical component of actuator 201 is activated and will urge pin 202 against user switch 205. This will disconnect the electric parts of the machine from the power supply connected to circuit 57. When the heater's temperature drops below the temperature limit, the thermo-mechanical component will return back into its normal state and pin 202 will either follow the thermo-mechanical component or may be pushed back into its normal position by a user who actuates switch 205 to re-establish the power connection of the machine.

In the embodiment shown in FIG. 14, the user switch 205 cooperating with the thermal fuse may also serve as a main switch that may be operated independently of any over-heat situation in order to ordinarily switch on and off the beverage or liquid food machine.

Conversely, in the embodiment shown in FIG. 15, the user switch 205 cooperating with the thermal fuse is a dedicated switch separate from the main switch 205'.

Fuse device 200 comprises a safety electric temperature sensor 203 mechanically mounted against heater 1 and in thermal communication therewith. Furthermore, to simplify assembly and further integrate the electric components of the machine, temperature sensor 203 is rigidly connected to PCB 50 in a similar manner as discussed above. In a less preferred embodiment, such a temperature sensor may also be connected by other means to the PCB, in particular in a partly or entirely flexible manner.

Temperature sensor 203 monitors the temperature of heater 1. Temperature sensor 203 is associated with a control means that controls the electrical powering of actuator 201' via its connection circuit 204 depending on the measured temperature. For instance, the control means includes a power switch, e.g. a transistor, on connection circuit 204 connected to temperature sensor 203.

Advantageously, the temperature sensor 203, the power switch associated therewith, user switches 205 and even actuator 201' are rigidly mounted onto PCB 4. Preferably these components are mounted on a section 41 of PCB 4 that is electrically insulated from the ordinary control unit of the beverage and liquid food machine on PCB 4. Hence, by having substantially all the electronic and electrical parts on the same PCB 4 but arranged in two distinct electrical circuits, mechanical assembly of the components is facilitated and the safety of the machine is increased.

What is claimed is:

1. A functional block comprising:
   a flow meter;
   a thermally and electrically insulating housing enclosing a printed circuit board on all sides of the printed circuit board and comprising snaps configured to assemble the functional block to a thermoblock;
   the thermoblock comprising a metal mass; and
   the printed circuit board configured for a liquid food or a beverage preparation machine, the printed circuit board comprising power connectors, a thermal fuse, and power pins that are each rigidly connected to the circuit board and each extend from an interior of the thermally and electrically insulating housing through corresponding openings in the thermally and electrically insulating housing to an exterior of the thermally and electrically insulating housing, the power connectors are configured for supplying electric heating power to the thermoblock via the power pins, the printed circuit board is rigidly connected to the flow meter, the flow meter comprising a magnetic field detector or hall sensor physically attached onto the printed circuit board, the flow meter further comprising a rotatable magnetic helix or turbine which is located within a duct or pipe that is arranged for circulating liquid in the liquid food or a beverage preparation machine, the rotatable magnetic helix or turbine rigidly secured to the printed circuit board, and the printed circuit board is arranged to control a triac for adjusting a heating current passed via the power pins, the adjusting of the heating current is based on measures of liquid flow by the flow meter and of a temperature of heated liquid by a temperature sensor connected to a plug member of the thermally and electrically insulating housing; and a user interface comprising at least one switch connected to the printed circuit board by the thermally and electrically insulating housing.

2. The functional block of claim 1, wherein the power connectors, the thermal fuse and the power pins are connected to the printed circuit board by rigid connector pins or blades or rigid plug and socket members.

3. The functional block of claim 1, wherein the power connectors, the thermal fuse and the power pins are secured on or in the metal mass.

4. The functional block of claim 1, wherein at least one electric component of the power connectors, the thermal fuse and the power pins is secured in a cavity of the metal mass by a biased spring element in the cavity or by the cavity forming a socket for a plug comprising the at least one electric component.

5. The functional block of claim 1, further comprising one or more of a resistor heater or a power switch, rigidly connected to the printed circuit board by a rigid electric power pin and a rigid power connector that has a socket for receiving the rigid electric power pin, wherein the rigid power connector is sufficiently resilient to allow displacement of the socket for self-positioning the socket around the rigid electric power pin and to secure electric contact between the rigid electric power pin and the rigid power connector.

6. The functional block of claim 5, wherein the rigid power connector comprises one or more spring blades to provide required resiliency.

7. The functional block of claim 1, wherein the thermally and electrically insulating housing is mechanically connected to the thermoblock, and the printed circuit board has one or more openings for passage of electrical connectors for connecting the printed circuit board to the power connectors, the thermal fuse and the power pins that are rigidly secured on or in the thermoblock.

8. The functional block of claim 1, wherein the printed circuit board is a flex-print secured to a surface of the thermoblock and has an inner side that faces the thermoblock and that incorporates a resistor heater in the form of a heating foil and an outer side to which the power connectors, the thermal fuse and the power pins are rigidly secured.

9. The functional block of claim 1, wherein the printed circuit board is arranged to control a pump or an electric interface of the liquid food or a beverage preparation machine.

10. The functional block of claim 1, wherein the metal mass comprising a heating chamber elongated along a direction of flow of the liquid through the metal mass, the heating chamber comprising an upper flow portion followed by a down-coming flow portion that has a narrowed cross-section for promoting an increased velocity of the liquid along the upper and the down-coming flow portions to inhibit accumulation of bubbles in the upper flow portion.

11. The functional block of claim 10, wherein the metal mass has an inlet and outlet that together with the heating chamber form a rigid, free-flow passage for guiding the liquid that circulates through the metal mass.

12. The functional block of claim 11, wherein the thermoblock comprises an upstream part of a brewing chamber, the upstream part being formed by or rigidly anchored in the metal mass so that the rigid, free-flow passage of the metal mass extends into the brewing chamber.

13. The functional block of claim 12, comprising a downstream part having a liquid food or beverage outlet and cooperating with the upstream part to form the brewing chamber, the downstream part and the upstream part being movable apart and movable together for supply of the liquid into the brewing chamber and evacuation of a beverage from the brewing chamber.

14. The functional block of claim 13, wherein the upstream part and the metal mass are fixed, the downstream part is movable to and from the upstream part; or the upstream part and the metal mass are movable en bloc to and from the downstream part, and the downstream part is fixed or movable.

15. The functional block of claim 1, further comprising:
an electric supply circuit connectable to an electric power source; and
a heater powered by the electric supply circuit, wherein the thermal fuse is in thermal communication with the heater and associated with the electric supply circuit, the thermal fuse arranged to interrupt the electric supply circuit from the electric power source when the heater exceeds a temperature limit, and wherein the thermal fuse is reversible and comprises a switch for automatically interrupting the electric supply circuit when the heater exceeds the temperature limit, the switch operable by a user to close the electric supply circuit when the heater has a temperature that has returned below the temperature limit.

16. The functional block of claim 15, wherein the thermal fuse comprises an actuator that is arranged to push out a pin, rod or piston against the switch when the temperature limit is exceeded by the heater so as to actuate the switch and open the electric supply circuit.

17. The functional block of claim 1, wherein the power connectors, the thermal fuse and the power pins are configured to control functions of the liquid food or beverage preparation machine that are additional to the thermoblock.

* * * * *